United States Patent
Zhou

(10) Patent No.: US 9,899,597 B2
(45) Date of Patent: Feb. 20, 2018

(54) MANUFACTURING METHODS OF ELECTROLUMINESCENT DEVICES

(71) Applicant: Shenzhen China Star Optoelectronics Technology Co., Ltd., Shenzhen, Guangdong (CN)

(72) Inventor: Kaifeng Zhou, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 249 days.

(21) Appl. No.: 14/908,118

(22) PCT Filed: Jan. 20, 2016

(86) PCT No.: PCT/CN2016/071479
§ 371 (c)(1),
(2) Date: Jan. 27, 2016

(87) PCT Pub. No.: WO2017/075914
PCT Pub. Date: May 11, 2017

(65) Prior Publication Data
US 2017/0271593 A1 Sep. 21, 2017

(30) Foreign Application Priority Data
Nov. 2, 2015 (CN) .......................... 2015 1 0732963

(51) Int. Cl.
*H01L 51/50* (2006.01)
*H01L 51/00* (2006.01)
(Continued)

(52) U.S. Cl.
CPC ...... *H01L 51/0006* (2013.01); *H01L 51/0038* (2013.01); *H01L 51/0043* (2013.01);
(Continued)

(58) Field of Classification Search
CPC ... H01L 51/006; H01L 51/56; H01L 51/0038; H01L 51/0043; H01L 51/0081;
(Continued)

(56) References Cited

U.S. PATENT DOCUMENTS 7,662,659 B2 * 2/2010 Kobayashi ............. B82Y 10/00
257/E29.069
8,193,010 B2 * 6/2012 Gopal ................... B82Y 10/00
257/E29.071
(Continued)

FOREIGN PATENT DOCUMENTS

CN 1822410 A 8/2006
CN 101533182 A 9/2009
(Continued)

*Primary Examiner* — Savitr Mulpuri
(74) *Attorney, Agent, or Firm* — Andrew C. Cheng

(57) ABSTRACT

A manufacturing method of electroluminescent devices includes: providing a first electrode; electrically depositing a first carrier injection layer on the first electrode to form a first electrode component; adopting a multiple transfer-print method to form a plurality of functional layers on the first electrode component in turn, one functional layer is manufactured by executing the transfer-print method once; and arranging a second electrode on the farthest functional layer away from the first carrier injection layer. The manufacturing method is capable of manufacturing the electroluminescent devices having a plurality of functional layers. The material utilization rate is high and the cost is low.

9 Claims, 4 Drawing Sheets

(51) Int. Cl.
    *H01L 51/56*     (2006.01)
    *H01L 51/52*     (2006.01)

(52) U.S. Cl.
    CPC ...... H01L 51/0081 (2013.01); H01L 51/5012 (2013.01); H01L 51/5056 (2013.01); H01L 51/5072 (2013.01); H01L 51/5088 (2013.01); H01L 51/5092 (2013.01); H01L 51/5206 (2013.01); H01L 51/5221 (2013.01); H01L 51/56 (2013.01)

(58) Field of Classification Search
    CPC ............. H01L 51/5012; H01L 51/5056; H01L 51/5072; H01L 51/5088; H01L 51/5092; H01L 51/5206; H01L 51/5221
    See application file for complete search history.

(56) References Cited

U.S. PATENT DOCUMENTS

| | | | | |
|---|---|---|---|---|
| 8,846,418 | B2* | 9/2014 | Kim | G03F 7/0002 438/48 |
| 2010/0143726 | A1* | 6/2010 | Golzhauser | B05D 1/283 428/446 |
| 2014/0087191 | A1* | 3/2014 | Chua | H01L 21/2007 428/408 |

FOREIGN PATENT DOCUMENTS

| | | |
|---|---|---|
| CN | 101662001 A | 3/2010 |
| CN | 103429370 A | 12/2013 |
| CN | 104742551 | 7/2015 |
| CN | 104752459 A | 7/2015 |
| CN | 104752460 A | 7/2015 |
| CN | 105098100 | 11/2015 |

\* cited by examiner

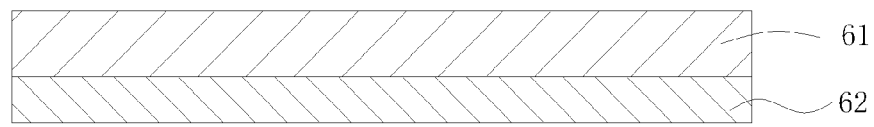
FIG. 4
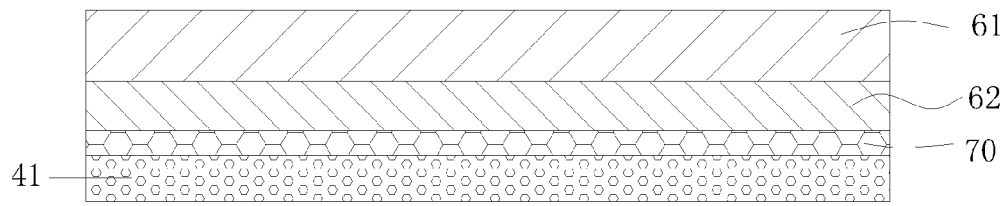
FIG. 5
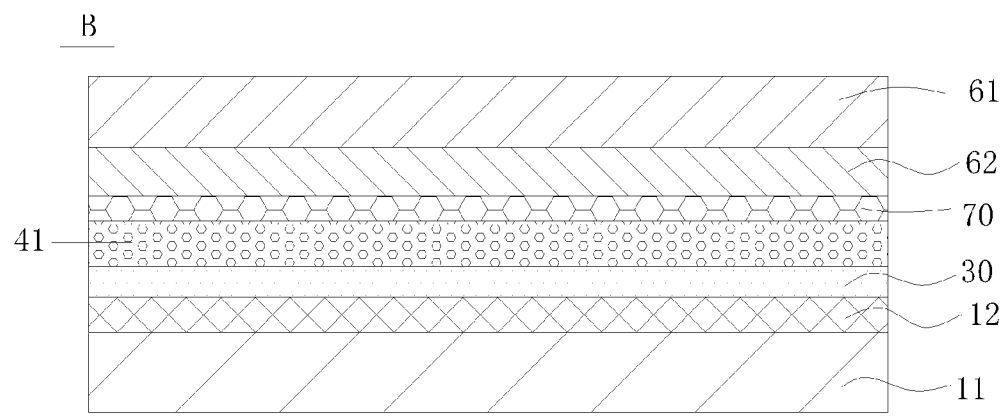
FIG. 6a
FIG. 6b

MANUFACTURING METHODS OF ELECTROLUMINESCENT DEVICES

CROSS REFERENCE

This application claims the priority of Chinese Patent Application No. 201510732963.5, entitled "Manufacturing methods of electroluminescent devices", filed on Nov. 2, 2015, the disclosure of which is incorporated herein by reference in its entirety.

FIELD OF THE INVENTION

The present invention relates to an electronic technology field, and more particularly to a manufacturing method of electroluminescent devices.

BACKGROUND OF THE INVENTION

The electroluminescent device may convert electrical energy to optical energy. The common structure of electroluminescent devices includes a transparent anode, a light-emitting layer and a cathode arranged on a transparent substrate. In order to improve the efficiency of organic electroluminescent light emitting device and reduce the turn-on voltage of the electroluminescent device, conventionally, a variety of other features layers, for example, an electrode surface modification layer, carrier injection layer, a carrier transporting layer, the barrier layer and the buffer layer, may be arranged between the electrode and the light emitting layer. The carrier injection layer is typically electron injection layer or hole injection layer, and a carrier transporting layer is typically an electron transport layer or a hole transport layer. With the increase of various functions of the film, the manufacturing process of the electroluminescent devices becomes more difficult and higher costs may be involved.

Conventionally, electroluminescent devices, especially organic electroluminescent device, are usually made by dry and wet production. Dry methods, such as vapor deposition and sputtering, may easily include multi-layer device structure to obtain better device performance, but fine mask and high vacuum equipment are needed. Material utilization is low, which may waste a lot of material, and thus results in high production costs. Wet preparation processes, such as electrochemical deposition method, a spin coating method and ink jet printing method,are simple, high material utilization, and easy to continuous production. But it is difficult to prepare a multi-layer device structure, and the light emitting efficiency is low. Among them, electrochemical deposition technique adopts organic molecules with electrochemical activity. The oxidation and the reductive coupling reactions occur at the interfaces between the electrode/solution to form polymer film. The method is characterized by attributes such as simple and low cost. The outlook, thickness, aggregation structure, etc. of the films may be configured by electrodeposition method and conditions. Usually, the functional layer is directly deposited on the anode of the electroluminescent device. However, after one functional layer is electrically deposited, the second functional layer cannot contact with the anode, and thus it is difficult to manufacture good electrically deposited film and it is difficult to manufacture the electroluminescent device having a plurality of functional layer, which results in a bad light emitting efficiency.

SUMMARY OF THE INVENTION

The technical issue that the embodiment of the present disclosure solves is to provide a manufacturing method of electroluminescent devices for manufacturing an electroluminescent device having a plurality of functional layers with high material usage rate and low cost.

In one aspect, a manufacturing method of electroluminescent devices includes: providing a first electrode; electrically depositing a first carrier injection layer on the first electrode to form a first electrode component; adopting a multiple transfer-print method to form a plurality of functional layers on the first electrode component in turn, one functional layer is manufactured by executing the transfer-print method once, the transfer-print method includes: providing a template electrode; arranged a sacrificial layer on the template electrode; electrically depositing the functional layer on the sacrificial layer; bonding the template electrode having the functional layer on one side of the first electrode component arranged with a first carrier injection layer to form an intermediate component, the functional layer faces toward the first carrier injection layer; and immersing the intermediate component within a solvent to resolve or to peel off the sacrificial layer to split up the template electrode and the functional layer; and arranging a second electrode on the farthest functional layer away from the first carrier injection layer.

Wherein the sacrificial layer is electrically conductive, and a thickness of the sacrificial layer is less than 10 nm.

Wherein the sacrificial layer is a monolayer.

Wherein the sacrificial layer is made by Poly(3,4-ethylenedioxythiophene)-poly(styrenesulfonate) (PEDOT:PSS).

Wherein the functional layers includes a first carrier transmission layer and a light emitting layer stacked on the first carrier injection layer in turn.

Wherein the functional layers includes a second carrier transmission layer and a second carrier injection layer stacked on the light emitting layer in turn.

Wherein the first electrode is an anode of the electroluminescent device, the second electrode is a cathode of the electroluminescent device, the first carrier injection layer is a hole injection layer, the second carrier injection layer is an electron injection layer, and the second electrode is arranged on the electron injection layer.

Wherein the first electrode is a cathode of the electroluminescent device, the second electrode is an anode of the electroluminescent device, the first carrier injection layer is an electron injection layer, the second carrier injection layer is a hole injection layer, and the second electrode is arranged on the hole injection layer.

Wherein the step of electrically depositing the functional layer on the sacrificial layer further includes: arranging Ag/AgCl within electrolyte solvent to be a reference electrode, arranging a platinum sheet to be a counter electrode, immersing the template electrode having the sacrificial layer within the electrolyte solvent to operate as an operational electrode, and applying an operational voltage, and electrically depositing one functional layer on the sacrificial layer.

Wherein the light emitting layer is tris (8-hydroxyquinoline) aluminum or poly-phenylene ethylene derivatives.

In view of the above, the sacrificial layer is arranged on the template electrode. After the functional layers are manufactured by the electro-deposition process, the functional layers are transferred to the first electrode component of the electroluminescent device. By resolving or peeling off the sacrificial layer, the template electrode may be repeatedly utilized. The sacrificial layer is then arranged on the template electrode again, and then another functional layer is produced via electro-deposition process. In this way, a plurality of functional layers may be obtained. The thickness of the sacrificial layer is smaller than 10 nm, even, the sacrificial layer is a monolayer. The sacrificial layer may be adopted to split up the functional layers and the template electrode, and may modify the surface of the template electrode, which eliminates the defects of the template electrode. As the functional layer is transferred to the first electrode of the electroluminescent device after being generated, the performance of the functional layer is good. In this way, the light emitting efficiency of the electroluminescent device is enhanced. At the same time, it is not necessary to adopt the high precision mask and high vacuum device.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

FIG. 4 is a schematic view of the template electrode in accordance with one embodiment.

FIG. 5 is a schematic view of the template electrode arranged with a sacrificial layer in accordance with one embodiment.

FIGS. 6a, 6b, and 6c are schematic views showing the process of manufacturing the first functional layer of the electroluminescent device in accordance with one embodiment.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
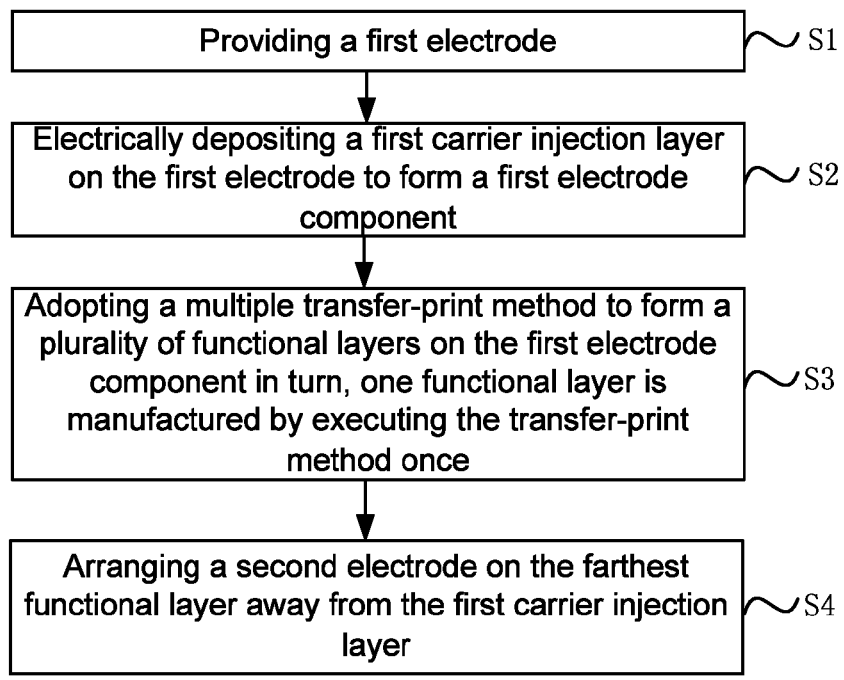
FIG. 1 is a flowchart chart illustrating a manufacturing method of the electroluminescent device in accordance with one embodiment.

FIG. 1 is a flowchart chart illustrating a manufacturing method of the electroluminescent device in accordance with one embodiment. The method includes steps S1, S2, S3, and S4.

Figure 2:
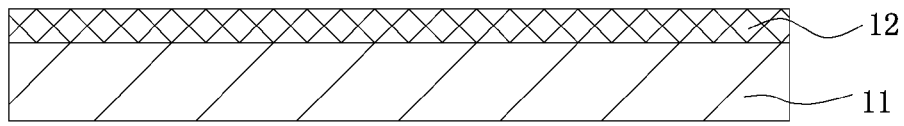
FIG. 2 is a schematic view showing the first electrode of the electroluminescent device in accordance with one embodiment.

In step S1, referring to FIG. 2. FIG. 2 is a schematic view showing the first electrode of the electroluminescent device in accordance with one embodiment.

In step S1, providing a first electrode 10.

The first electrode 10 includes a transparent substrate 11 and a transparent conductive layer 20 arranged on the first transparent substrate 11.

In the embodiment, the first transparent substrate 11 operates as a base of the electroluminescent device. The first transparent substrate 11 may be a glass substrate, sapphire, diamond or a transparent polymer film, such as polyethylene terephthalate film or polyimide film. A transparent conductive layer 12 is arranged on the first transparent substrate 11. The transparent conductive layer 12 may be arranged on the first transparent substrate 11 via coating or sputtering. The transparent conductive layer 12 is a transparent electrode. The thickness of the transparent conductive layer 12 is in a range between 100 nm and 500 nm.

Figure 3:
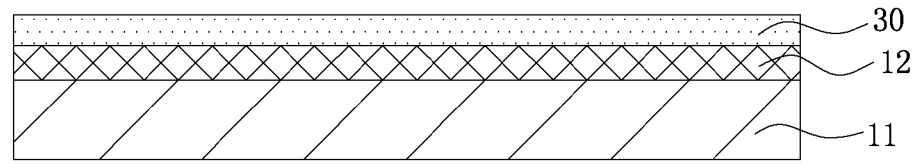
FIG. 3 is a schematic view of the deposited first carrier injection layer of the electroluminescent device in accordance with one embodiment.

In step S2, please also refer to FIG. 3. FIG. 3 is a schematic view of the deposited first carrier injection layer of the electroluminescent device in accordance with one embodiment.

In steps S2, electrically depositing a first carrier injection layer 30 on the first electrode 10 to form a first electrode component (A). The first carrier injection layer 30 may be made by Poly(3,4-ethylenedioxythiophene)-poly(styrenesulfonate) (PEDOT:PSS), and a thickness of the first carrier injection layer 30 may be within a range between 20 and 60 nm.

Figure 6C:
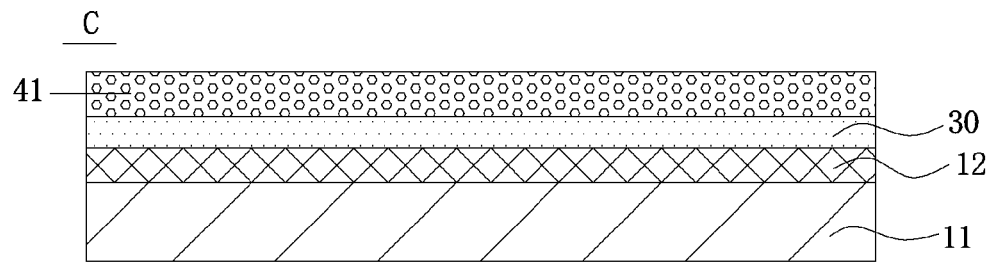
Figure 7A:
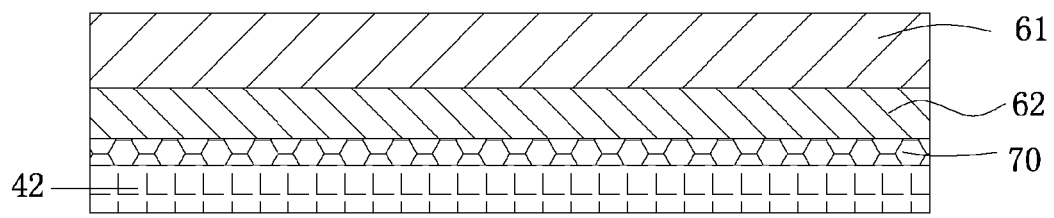
FIGS. 7a, 7b, and 7c are schematic views showing the process of manufacturing the second functional layer of the electroluminescent device in accordance with one embodiment.
Figure 7B:
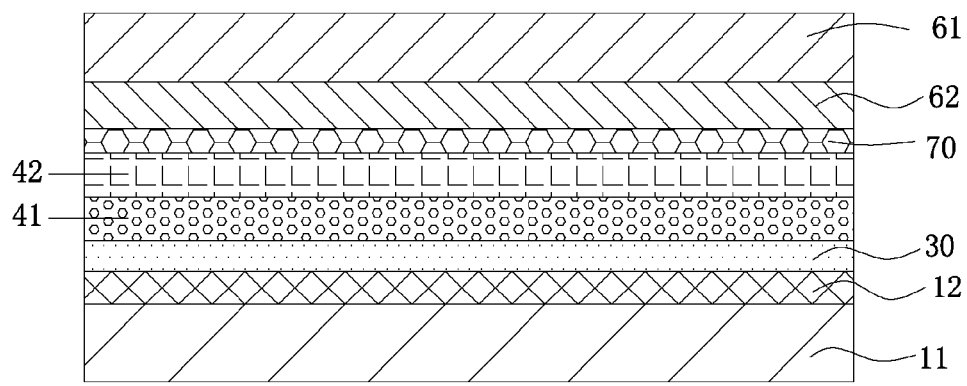
Figure 7C:
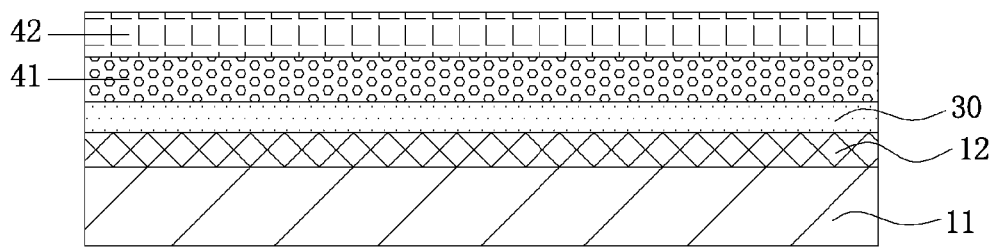
Figure 8:
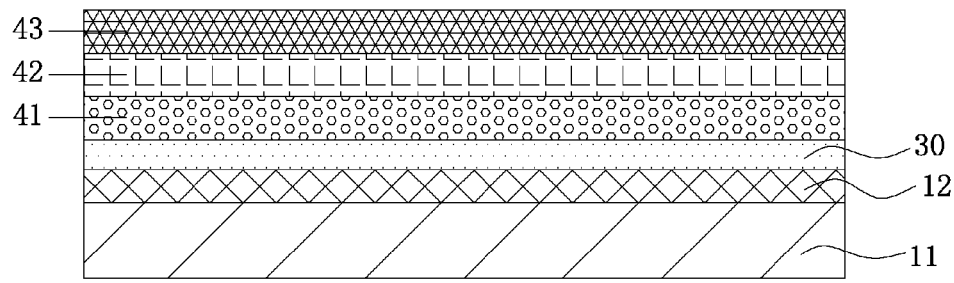
FIG. 8 is a schematic view of the third functional film of the electroluminescent device in accordance with one embodiment.
Figure 9:
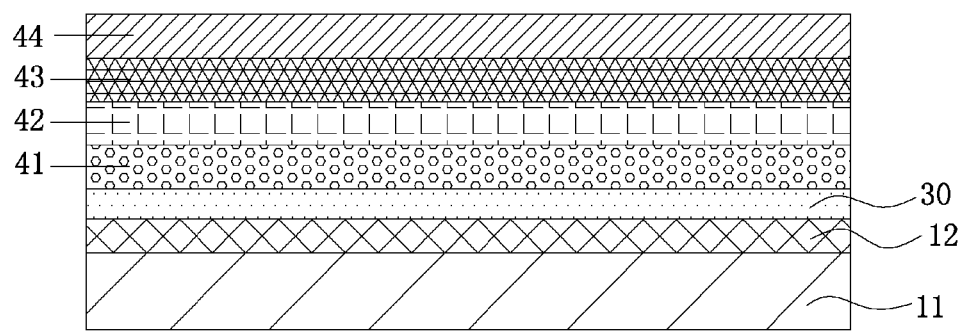
FIG. 9 is a schematic view of the third functional film of the electroluminescent device in accordance with one embodiment.

In step S3, please refer to FIGS. 4-9. FIG. 4 is a schematic view of the template electrode in accordance with one embodiment. FIG. 5 is a schematic view of the template electrode arranged with a sacrificial layer in accordance with one embodiment. FIGS. 6a, 6b, and 6c are schematic views showing the process of manufacturing the first functional layer of the electroluminescent device in accordance with one embodiment. FIGS. 7a, 7b, and 7c are schematic views showing the process of manufacturing the second functional layer of the electroluminescent device in accordance with one embodiment. FIG. 8 is a schematic view of the third functional film of the electroluminescent device in accordance with one embodiment. FIG. 9 is a schematic view of the third functional film of the electroluminescent device in accordance with one embodiment.

In step S3, a plurality of functional layers 40 are stacked on the first electrode 10 by a multiple transfer-print method. Each transfer-print step manufactures one functional layer. The transfer-print step includes steps S01, S02, S03, S04, S05, S06, and S07.

In step S01: providing a template electrode, referring to FIG. 4.

In the embodiment, the template electrode 60 includes a template base 61 and an operational electrode 62. The operational electrode 62 may be ITO, aluminum, gold or other metal. The thickness of the operational electrode may be within a range between 100 and 500 nm. The template electrode 60 may be patterned in accordance with the structure or the function of the electroluminescent device such that the corresponding functional layer of the electroluminescent device may be patterned.

In step S02, a sacrificial layer 70 is arranged on the template electrode 60, referring to FIG. 5.

The sacrificial layer 70 is electrically conductive, and the thickness of the sacrificial layer 70 is smaller than 10 nm. Preferably, the thickness of the sacrificial layer 70 is the thickness of the monolayer, that is, the sacrificial layer 70 is the monolayer. Preferably, the sacrificial layer 70 is made by Poly(3,4-ethylenedioxythiophene)-poly(styrenesulfonate) (PEDOT:PSS). The sacrificial layer 70 may be arranged on the template electrode 60 by self-assembled or spin-coating. The thickness of the sacrificial layer 70 is small, which may not affect electrodeposition. In addition, the sacrificial layer 70 may modify the template electrode 60 to eliminate the defects on the surface of the operational electrode 62, which enhances the quality of the film generated by the electrodeposition. The sacrificial layer 70 may be resolved in alcohol or solution having hydro-alcohol. The sacrificial layer 70 may be resolved or peeled off within the hydro-alcohol solution.

With respect to steps S03, S04, and S05, please refer to FIGS. 6a, 6b, and 6c. FIGS. 6a, 6b, and 6c are schematic views showing the process of manufacturing the first functional layer of the electroluminescent device in accordance with one embodiment.

In step S03, a first functional layer 41 is electrically deposited on the sacrificial layer 70.

Ag/AgCl is installed within electrolyte solution to operate as a reference electrode, and a platinum sheet operates as a counter electrode. The template electrode 60 having the sacrificial layer 70 is immersed into the electrolyte solution to be the electrically deposited operational electrode. The operational voltage is applied to form the first functional layer 41 on the sacrificial layer 70.

The electrolyte in the electrolyte solution is the precursor of the first functional layer 41. For instance, a first functional layer is the hole injection layer of the electroluminescent device, which is made by poly (3,4-ethylene dioxythiophene). The electrolyte solution in the electrolyte is the precursor of the poly (3,4-ethylene dioxythiophene) premer: 3,4-ethylene dioxythiophene monomer. A concentration of the electrolyte solution may be in the range between 1 mg/mL and 100 mg/mL. The operational voltage is in the range between −5V and 5V, which may be adjusted according to demand.

In step S04, the template electrode 60 having the first functional layer 41 is bonded with one side of the first electrode component having the first carrier injection layer 30. The first functional layer 41 faces toward the first carrier injection layer 30 to form an intermediate component (B).

That is, the first functional layer 41 directly bonds into the first carrier injection layer 30 of the first electrode component (A). The template electrode 60 having the first functional layer 41 may be bonded with the first electrode component (A) having the first carrier injection layer 30 by mechanical fits under vacuum or nitrogen conditions to prevent from being damaged by water or oxygen. In can be understood that the template electrode 60 may be bonded with the first electrode component (A) via other ways, such as liquid optical adhesive.

In step S05, the intermediate component (B) is immersed into solvent to resolve or peel off the sacrificial layer 70 so as to split the template electrode 60 and the first functional layer 41.

The solvent may be alcohol solvent or solvent mixed by water and alcohol. The sacrificial layer 70 is resolved within the solvent or is peeled off within the solvent such that the operational electrode 62 on the template electrode 60 and the first functional layer 41 on the first electrode component (A) are not connected, and thus the template electrode 60 and the first functional layer 41 are split up. In this way, the first functional layer 41 is transferred into the surface of the first carrier injection layer 30 of the first electrode component (A) to form a first electrode component (C).

Regarding step S06, please refer to FIGS. 7a, 7b, 7c, 8, and 9. FIGS. 7a, 7b, and 7c are schematic views showing the process of manufacturing the second functional layer of the electroluminescent device in accordance with one embodiment. FIG. 8 is a schematic view of the third functional film of the electroluminescent device in accordance with one embodiment. FIG. 9 is a schematic view of the third functional film of the electroluminescent device in accordance with one embodiment.

In step S06, steps S01 through S05 are repeated several times to obtain the first functional layer 41, the second functional layer 42, the third functional layer 43, and the fourth functional layer 44. The details of this step are described hereinafter.

The template electrode 60 obtained in step S05 is cleaned, and is coated with the sacrificial layer 70 again. The template electrode 60 coated with the sacrificial layer 70 is arranged within the electrolyte solvent having the reference electrode and the counter electrode to perform electrodeposition to form the second functional layer 42 on the sacrificial layer 70. The template electrode 60 having the second functional layer 42 is bonded with the first electrode component (C) having the first functional layer 41 such that the second functional layer 42 is directly bonded with the first functional layer 41. Afterward, the template electrode 60 and the first electrode component (C) are arranged within the solvent mixed by water and alcohol to resolve or to peel off the sacrificial layer 70. In this way, the second functional layer 42 and the template electrode 60 are not connected and the second functional layer 42 and the template electrode 60 are split up. In this way, the second functional layer 42 on the template electrode 60 is transferred to the first functional layer 41 of the first electrode component (C). In the embodiment, when repeatedly manufacturing the functional layers, the template electrode 60 may be utilized repeatedly. Alternatively, different template electrodes may be adopted when manufacturing different functional layers.

The step S01 through S05 are repeated again to overlap the third functional layer 43 on the second functional layer 42. The step S01 through S05 are repeated again to overlap the fourth functional layer 44 on the third functional layer 43. The step S01 through S05 are repeated to obtain multiple functional layers 40 having good quality. At the same time, the material utilization rate is also high. In the embodiment, there are four functional layers 40. In other embodiments, the functional layers 40 may be more or less than four.

Figure 10:
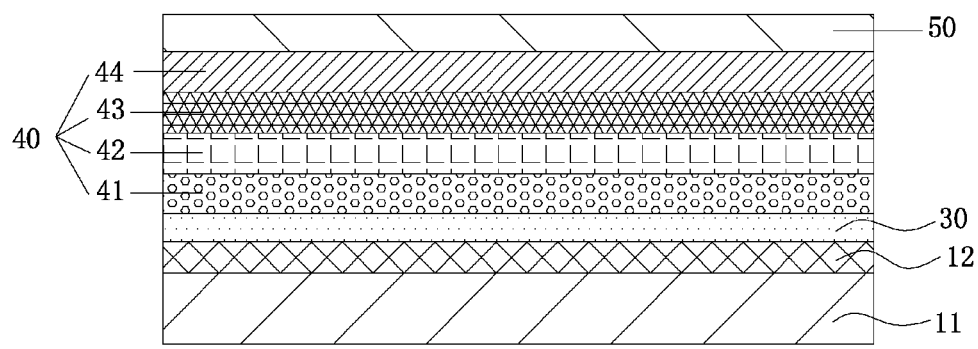
FIG. 10 is a schematic view of the third functional film of the electroluminescent device in accordance with one embodiment.

Regarding step S4, please refer to FIG. 10. FIG. 10 is a schematic view of the third functional film of the electroluminescent device in accordance with one embodiment.

In step S4, a second electrode 50 is arranged on the farthest functional layer away from the first carrier injection layer 30.

In the embodiment, the farthest functional layer away from the first carrier injection layer 30 is the fourth functional layer 44, and thus the second electrode 50 is arranged on the fourth functional layer 44.

In one embodiment, the first functional layer 41 is a first carrier transmission layer, the second functional layer 42 is the light emitting layer, the third functional layer 43 is the second carrier transmission layer, and the fourth functional layer 44 is the second carrier injection layer. Specifically, the first electrode 10 is the anode of the electroluminescent device. That is, the anode is the transparent electrode. The first carrier injection layer 30 is the hole injection layer. The first carrier transmission layer is the hole transmission layer, the second carrier injection layer is the electron injection layer, the second carrier transmission layer is the electron transmission layer, and the second electrode 50 is the cathode of the electroluminescent device. Thus, the structure of the electroluminescent device includes the anode 20, the hole injection layer 30, the hole transmission layer 41, the light emitting layer 42, the electron transmission layer 43, the electron injection layer 44, and the cathode 50 stacked in turn, as shown in FIG. 10.

In one embodiment, the first functional layer 41 is a first carrier transmission layer, the second functional layer 42 is the light emitting layer, the third functional layer 43 is the second carrier transmission layer, and the fourth functional layer 44 is the second carrier injection layer. Specifically, the first electrode 10 is the cathode of the electroluminescent device. That is, the cathode is the transparent electrode. The first carrier injection layer 30 is the electron injection layer. The first carrier transmission layer is the electron transmission layer, the second carrier injection layer is the hole injection layer, the second carrier transmission layer is the holetransmission layer, and the second electrode 50 is the anode of the electroluminescent device.

Thus, the structure of the electroluminescent device includes the cathode 20, the electron injection layer 30, the electron transmission layer 41, the light emitting layer 42, the hole transmission layer 43, the hole injection layer 44, and the anode 50 stacked in turn, as shown in FIG. 10.

In one embodiment, the anode may be made by ITO having a thickness in a range between 100 and 500 nm. Alternatively, the anode may be Al and/or Au having a thickness in a range between 10 and 50 nm. The cathode may be made by Al, Ag, or Mg having a thickness in a range between 100 and 500 nm. The hole injection layer and the hole transmission layer may be made by Poly (3,4-ethylene dioxythiophene)-polystyrene sulfonate (PEDOT:PSS) having a thickness in a range between 20 and 60 nm. The electron injection layer and the electron transmission layer may be made by LiF or TPBI having a thickness in a range between 1 and 20 nm. The light emitting layer may be electroluminescent material capable of electrochemical polymerization, such as tris (8-quinolinol) aluminum, poly-p-phenylene ethylene (poly (p-phenyl vinyl)) derivatives, TCPC, TCBzC or TCNzC, and the thickness is in the range between 20 nm and 100 nm.

In the embodiment, the sacrificial layer is arranged on the template electrode. After the functional layers are manufactured by the electro-deposition process, the functional layers are transferred to the first electrode component of the electroluminescent device. By resolving or peeling off the sacrificial layer, the template electrode may be repeatedly utilized. The sacrificial layer is then arranged on the template electrode again, and then another functional layer is produced via electro-deposition process. In this way, a plurality of functional layers may be obtained. The thickness of the sacrificial layer is smaller than 10 nm, even, the sacrificial layer is a monolayer. The sacrificial layer may be adopted to split up the functional layers and the template electrode, and may modify the surface of the template electrode, which eliminates the defects of the template electrode. As the functional layer is transferred to the first electrode of the electroluminescent device after being generated, the performance of the functional layer is good. In this way, the light emitting efficiency of the electroluminescent device is enhanced. At the same time, it is not necessary to adopt the high precision mask and high vacuum device.

Above are embodiments of the present invention, which does not limit the scope of the present invention. Any modifications, equivalent replacements or improvements within the spirit and principles of the embodiment described above should be covered by the protected scope of the invention.

What is claimed is:

1. A manufacturing method of electroluminescent devices, comprising:
providing a first electrode;
electrically depositing a first carrier injection layer on the first electrode to form a first electrode component;
adopting a multiple transfer-print method to form a plurality of functional layers on the first electrode component, one functional layer is manufactured by executing the transfer-print method once, the transfer-print method comprises:
providing a template electrode;
arranged a sacrificial layer on the template electrode;
electrically depositing the functional layer on the sacrificial layer;
bonding the template electrode having the functional layer on one side of the first electrode component arranged with a first carrier injection layer to form an intermediate component, the functional layer faces toward the first carrier injection layer;
immersing the intermediate component within a solvent to resolve or to peel off the sacrificial layer to split up the template electrode and the functional layer;
arranging a second electrode on the farthest functional layer away from the first carrier injection layer; and
wherein the functional layers comprises a first carrier transmission layer and a light emitting layer stacked on the first carrier injection layer.

2. The manufacturing method as claimed in claim 1, wherein the sacrificial layer is electrically conductive, and a thickness of the sacrificial layer is less than 10 nm.

3. The manufacturing method as claimed in claim 2, wherein the sacrificial layer is a monolayer.

4. The manufacturing method as claimed in claim 3, wherein the sacrificial layer is made by Poly(3,4-ethylenedioxythiophene)-poly(styrenesulfonate) (PEDOT PSS).

5. The manufacturing method as claimed in claim 1, wherein the functional layers comprises a second carrier transmission layer and a second carrier injection layer stacked on the light emitting layer.

6. The manufacturing method as claimed in claim 5, wherein the first electrode is an anode of the electroluminescent device, the second electrode is a cathode of the electroluminescent device, the first carrier injection layer is a hole injection layer, the second carrier injection layer is an electron injection layer, and the second electrode is arranged on the electron injection layer.

7. The manufacturing method as claimed in claim 5, wherein the first electrode is a cathode of the electroluminescent device, the second electrode is an anode of the electroluminescent device, the first carrier injection layer is an electron injection layer, the second carrier injection layer is a hole injection layer, and the second electrode is arranged on the hole injection layer.

8. The manufacturing method as claimed in claim 7, wherein the step of electrically depositing the functional layer on the sacrificial layer further comprises:
arranging Ag/AgCl within electrolytesolvent to be a reference electrode;
arranging a platinum sheet to be a counter electrode;

immersing the template electrode having the sacrificial layer within the electrolyte solvent to operate as an operational electrode; and applying an operational voltage, and electrically depositing one functional layer on the sacrificial layer.

9. The manufacturing method as claimed in claim 7, wherein the light emitting layer is tris (8-hydroxyquinoline) aluminum or poly-phenylene ethylene derivatives.

* * * * *